United States Patent
Polakovic et al.

(10) Patent No.: US 6,454,868 B1
(45) Date of Patent: *Sep. 24, 2002

(54) PERMANGANATE DESMEAR PROCESS FOR PRINTED WIRING BOARDS

(75) Inventors: Frank Polakovic, Plymouth, MN (US); William Yang, Chungli (TW); Charles Edwin Thorn, Newport, KY (US); Michael Val Carano, Plymouth; Beth Ann LaFayette, Minneapolis, both of MN (US)

(73) Assignee: Electrochemicals Inc., Maple Plain, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/550,881

(22) Filed: Apr. 17, 2000

(51) Int. Cl.$^7$ ............................................... C03C 23/00
(52) U.S. Cl. ........................... 134/2; 134/28; 134/39; 134/41; 510/175
(58) Field of Search ................ 134/2, 28, 39, 134/41; 510/174, 175, 176

(56) References Cited

U.S. PATENT DOCUMENTS

| | | | |
|---|---|---|---|
| 4,117,080 A | 9/1978 | Kawasaki et al. | 423/235 |
| 4,316,322 A | 2/1982 | Tranberg | 29/852 |
| 4,425,380 A | 1/1984 | Nuzzi et al. | 427/97 |
| 4,592,852 A | 6/1986 | Courduvelis et al. | 252/79.1 |
| 4,601,783 A | 7/1986 | Krulik | 156/655 |
| 4,640,719 A | 2/1987 | Hayes et al. | 134/40 |
| 4,775,557 A | 10/1988 | Bastenbeck et al. | 427/307 |
| 4,820,548 A | 4/1989 | Courduvelis | 427/98 |
| 4,853,095 A | 8/1989 | D'Ambrisi | 204/82 |
| 4,873,122 A | 10/1989 | Darken | 427/97 |
| 4,911,802 A | 3/1990 | D'Ambrisi | 204/82 |
| 5,019,229 A | 5/1991 | Grapentin et al. | 204/130 |
| 5,032,427 A | 7/1991 | Kukanskis et al. | 427/97 |
| 5,104,687 A | 4/1992 | Tomaiuolo et al. | 427/98 |
| 5,132,038 A | 7/1992 | Kukanskis et al. | 252/139 |
| 5,271,775 A | 12/1993 | Asano et al. | 134/40 |
| 5,311,660 A | 5/1994 | Alpaugh et al. | 29/852 |
| 5,334,331 A | 8/1994 | Fusiak | 252/542 |
| 5,427,895 A | 6/1995 | Magnuson et al. | 430/314 |
| 5,473,118 A | 12/1995 | Fukutake et al. | 174/258 |
| 5,554,312 A | 9/1996 | Ward | 510/175 |
| 5,558,109 A | 9/1996 | Cala et al. | 134/42 |
| 5,612,303 A | 3/1997 | Takayanagi et al. | 510/174 |
| 5,688,753 A | 11/1997 | Cala et al. | 510/175 |
| 5,690,747 A | 11/1997 | Docher | 134/1 |
| 5,730,890 A | 3/1998 | Bickford et al. | 216/87 |
| 5,755,893 A | 5/1998 | Cala et al. | 134/2 |
| 5,798,323 A | 8/1998 | Honda et al. | 510/176 |
| 5,800,858 A | 9/1998 | Bickford et al. | 427/97 |
| 5,814,588 A | 9/1998 | Cala et al. | 510/175 |
| 5,985,040 A | 11/1999 | Carano et al. | 134/2 |
| 6,150,282 A * | 11/2000 | Rath et al. | 438/745 |
| 6,261,745 B1 * | 7/2001 | Tanabe et al. | 430/331 |

FOREIGN PATENT DOCUMENTS

JP  64-081949  *  3/1989  ........... G03C/11/00

OTHER PUBLICATIONS

Neusch, "Engineer's Fact File, Primer on High–Performance Laminates," Electronic Packaging & Production, p. 39 (Jun., 1997).

Spitz, "Specialty Laminates Fill Special Needs," Electronic Packaging & Production, pp. 108–111 (Feb., 1989).

* cited by examiner

Primary Examiner—Randy Gulakowski
Assistant Examiner—Jiri Smetana
(74) Attorney, Agent, or Firm—McAndrews, Held & Malloy, Ltd.

(57) ABSTRACT

A desmear process for removing resin smeared on an interior wall of a through hole drilled in a resinous substrate, especially resinous substrates made from epoxy, polyimide, cyanate ester resins or bis-maleimide triazine epoxy resins. The process involves contacting the resin smear with a mixture of gamma-butyrolactone and water to soften the resin smear, followed by treatment with an alkaline permanganate solution to remove the softened resin, and treatment with an aqueous acidic neutralizer to neutralize and remove the permanganate residues. The gamma-butyrolactone is effective as a single solvent for softening and swelling resin smears from substrates made from epoxy, polyimide, cyanate ester resins, bis-maleimide triazine epoxy resins, and polyimide resins.

12 Claims, No Drawings

PERMANGANATE DESMEAR PROCESS FOR PRINTED WIRING BOARDS

TECHNICAL FIELD

The present invention is directed to printed wiring boards having through holes and, in particular, to a desmearing process and a solvent used therein for removing resin smear after drilling the through holes.

BACKGROUND OF THE INVENTION

Printed circuit boards are formed from a layer of conductive material (commonly, copper or copper plated with solder or gold) carried on a substrate of insulating material (commonly glass-fiber-reinforced epoxy resin). A printed circuit board having two conductive surfaces positioned on opposite sides of a single insulating layer is known as a "double-sided circuit board." To accommodate even more circuits on a single board, several copper layers are sandwiched between boards or other layers of insulating material to produce a multilayer circuit board.

To make electrical connections between two or more circuit layers on opposite sides of a double-sided circuit board, a hole is first drilled through the two conducting circuit layers and the insulator board. These holes are known in the art as "through holes," particularly if they extend through the entire circuit board. Through holes are typically from about 0.05 mm to about 5 mm in diameter and from about 0.025 mm to about 6 mm long. The through hole initially has a nonconductive cylindrical bore communicating between the two conductive surfaces. A conductive material or element is positioned in the through hole and electrically connected with the conducting sheets or layers to complete an electrical connection.

Like double-sided circuit boards, multilayer circuit boards also use holes in an intervening insulating layer to complete circuits between the circuit patterns on opposite sides of the insulating layer, as well as intermediate layers. Unless the context indicates otherwise, references in this specification to "through holes" refer to these holes in multilayer boards as well, even if they do not literally go through the entire circuit board.

When a through hole is drilled through a double-sided or multilayer circuit board, the act of drilling leaves a smear of insulating material in the barrel of the hole, as well as on the conductive surface. This smear must be removed prior to positioning or depositing the conductive material or element in the through hole if conductive contact between the through hole and the conducting sheets or layers is to be achieved.

Smear removal processes and solvents are known in the art. Several mechanical and chemical desmear methods that are known in the art are described in U.S. Pat. No. 4,601,783, issued Jul. 22, 1986 to Krulik. One common smear removal process utilizes an alkaline permanganate solution to remove the resin smear. U.S. Pat. No. 4,820,548 to Courduvelis et al. describes an alkaline permanganate desmear process that involves three chemical steps. In the first step, called solvent etch, a solvent is applied to attack and soften the resin structure of the smeared material; in the second step, a permanganate oxidizer is applied to remove the swelled resin; in the third step, a neutralizer is applied to neutralize and remove the permanganate from the resin surface. Suggested solvents for use in the disclosed desmear process include alkaline solutions of propylene glycol ethers. Other known solvents for use in permanganate desmear processes include such chemicals as ethylene glycol monobutyl ether, diethylene glycol monobutyl ether, or tripropylene glycol methyl ether. Permanganate oxidizers used in the desmear process include alkaline solutions of sodium, potassium or lithium permanganate. Neutralizers used in the permanganate desmear process are typically oxalic acid or aqueous acidic solutions such as dilute sulfuric acid or hydrochloric acid. Other known neutralizers are acidified stannous chloride, hydroxylamine hydrochloride or formaldehyde.

The known solvents used in permanganate desmear processes work fairly well in removing resin smear from a laminate material extensively used and known in the industry by the designation FR4, which is a fire retardant epoxy resin fiberglass cloth laminate having a glass transition temperature (Tg) of about 140° C. In recent years, however, specialized materials, resins and fillers have been used to develop new printed circuit board laminates having improved properties adequate for both state-of-the-art processing and performance requirements. Due to their chemical structure, the specialized resins developed for high performance laminates are very difficult to desmear using permanganate chemical processes. One such specialized resin is an epoxy, polyimide, cyanate ester resin system marketed by Allied Signal under the trademark RCC® (Tg=160° C.). Another high performance resin is BT epoxy, a combination of bis-maleimide triazine (BT) resin and an epoxy resin (Tg=185–195° C.). A further high performance resin is polyimide resin, which can have a Tg rangining from 250° C. to 300° C. or more depending upon the polyimide resin system. Permanganate desmear processes can be used for smear removal of such high performance or specialized resins, but satisfactory smear removal can only be achieved at the highest recommended levels of solvent and permanganate. For many users, such high levels are not practical.

In U.S. Pat. No. 5,985,040, assigned to the same assignee as the present application, there is disclosed an alternative solvent system that provides increased resin smear removal from high performance laminates compared to standard permanganate desmear processes. The alternative solvent comprises a mixture of at least two solvent components, with at least one solvent selected from a first group consisting of gamma-butyrolactone, ethyl-3-ethoxy-propionate, N-ethyl-2-pyrrolidone, N-(2-hydroxyethyl)-2-pyrrolidone, N-cyclohexyl-2-pyrrolidone, and N-octyl-2-pyrrolidone and mixtures thereof, and at least one solvent selected from a second group consisting of N-methyl-2-pyrrolidone, 2-pyrrolidone, tetrahydrofuran, N-ethyl-2-pyrrolidine, N-cyclohexyl-2-pyrrolidone, and N-dodecyl-2-pyrrolidone. The solvents are selected so that the solvent of the first group is different from the solvent or solvents from the second group, and there is a mixture of at least two solvents. It was emphasized in the patent disclosure that better smear removal was achieved with a combination of solvents from the first and second groups than if a solvent from the second group was used alone.

The combination of solvents disclosed in U.S. Pat. No. 5,985,040 is highly desirable for removing resin smears of high performance resins, such as RCC® and BT resins, and is very useful for removing resin smears from laminate circuit boards that are comprised of combinations of different resin materials, such as RCC® and FR-4 materials, in different layers. As can be seen from Table B in the patent, the combination of solvents provides a fairly uniform smear removal rate for the different resin materials that make up such combination laminates. One drawback with using a combination of solvents, however, is that the relative concentrations of the solvents in the combination can be difficult to control under production conditions.

It has now been found that, for circuit boards made from a single substrate material, satisfactory smear removal can be achieved using a particular solvent, gamma-butyrolactone, alone. This single solvent is useful for removing resin smears from circuit boards made from FR-4 materials, as well as from high performance epoxy resin materials such as RCC® and BT resins. However, because the gamma-butyrolactone solvent alone can give uneven smear removal rates for the different resin materials, it is not as effective as the combination of solvents for removing resin smear from laminates made with combinations of resin materials. Nevertheless, for circuit boards made with a single substrate material, utilizing a single solvent provides an advantage over the combination of solvents disclosed in U.S. Pat. No. 5,985,040 because the concentration of a single solvent is easier to control under production conditions.

SUMMARY OF THE INVENTION

An object of the present invention is to provide a solvent that provides increased smear removal compared to standard permanganate desmear processes.

A further object of the invention is to provide a process that is useful for preparing a resinous substrate for subsequent metallization.

Another object of the invention is to provide a hole cleaning process for use on high performance circuit board substrate materials, especially materials employing RCC® or BT resins, that is easily controlled under production conditions.

Another object of the invention is to provide a process for simultaneously cleaning resin smears from the inside walls of through holes and preparing the inside walls for subsequent metallization.

One aspect of the invention involves utilizing an aqueous solution of a single solvent, gamma-butyrolactone, to soften the resin smears on high performance materials, especially those made with RCC® or BT resin systems.

Another aspect of the invention provides a process for removing resin smears from a resinous substrate which comprises the following steps:

(a) contacting the resinous substrate with a mixture comprising a solvent component and water to soften and swell the resin smear, the solvent component consisting essentially of gamma-butyrolactone;

(b) contacting the resinous substrate with an alkaline permanganate solution for a time period sufficient to remove the softened resin smear; and (c) contacting the resinous substrate with an aqueous acidic solution for a time period sufficient to neutralize the alkaline permanganate solution and remove substantially all manganate residues.

DETAILED DESCRIPTION OF THE INVENTION

While the invention will be described in connection with one or more preferred embodiments, it will be understood that the invention is not limited to those embodiments. On the contrary, the invention includes all alternatives, modifications, and equivalents as may be included within the spirit and scope of the appended claims.

The process of the invention employs a liquid mixture of a solvent and water that is particularly useful for softening resin smears that result from drilling through holes in circuit boards, especially circuit boards made from a single substrate material such as RCC® or BT resins. The solvent component of the liquid mixture consists essentially of gamma- butyrolactone and the water component is preferably deionized water. The term "consisting essentially of" as used herein is intended to limit the essential resin softening component to gamma-butyrolactone but does not preclude the presence of minor amounts of one or more solvents that do not contribute to the resin softening function. In general, a "minor amount" is less than about 10% by volume. The amount of gamma-butyrolactone in the mixture can range from about 20% by volume to about 80% by volume of the mixture. An optimum amount of butyrolactone is from 40% by volume to 50% by volume of the mixture.

An optional component of the gamma-butyrolactone solvent and water mixture used in the present invention is a surfactant. One function of the surfactant is to decrease surface tension in the solvent so that the solvent is able to better penetrate the through holes. Better penetration in the through holes results in better and more uniform resin smear removal.

The amount of surfactant that is used in the solvent and water mixture will vary depending upon the surfactant and the particular application. To determine the amount of surfactant that is required for a particular application, one can begin by adding about 0.01% by volume surfactant to the gamma-butyrolactone solvent and water mixture and increasing the amount until the desired performance is achieved. Although additional amounts of surfactant could be added, they might not provide any additional benefit.

The diameters of the through holes are typically within the range of 0.05 mm to 5 mm. With through hole sizes within the range of 4–5 mm, a surfactant may not be necessary. However, with through hole sizes below 4 mm, an increasing amount of surfactant is recommended with decreasing through hole diameters. The circuit boards may vary in thickness (and thus their through holes may vary in length) from that of a double-sided circuit board to a multi-layer circuit board having up to twenty-four layers or more. Thus, when needed, the gamma-butyrolactone solvent and water mixture used in the present invention should contain sufficient surfactant to allow the solvent to penetrate the through holes in circuit boards having through holes of different sizes.

The gamma-butyrolactone solvent and water mixture typically contains an amount of surfactant ranging from about 0.01% to about 1% by volume, or from about 0.02% to about 0.5% by volume, or from about 0.05 to about 0.1% by volume of the mixture.

Surfactants contemplated to be suitable for use herein include FLUORAD® FC-171, FC-120, FC-430, FC-431, FC-129 and FC-95 anionic fluorochemical surfactants sold by Minnesota Mining and Manufacturing Co., St. Paul, Minn.; and ZONYL® FSN, FSB, FSP, FSJ, FSC, FSA aqueous fluorosurfactants sold by DuPont, Wilmington, Del. Other suitable surfactants are also contemplated.

The solvent and water mixture of the present invention may be prepared quite easily. Gamma-butyrolactone, together with water and a surfactant, if required, are added to a beaker or other container having a mixing bar or other mixing capability, and the components are mixed for a period of time sufficient to obtain a generally homogenous mixture. In general, the mixing time will be about 20 seconds to about 2 minutes to achieve thorough mixing. Heat may also be applied to speed up the mixing process. For example, it is desirable to heat the components to a temperature in the range of about 140° to about 180° F., with a temperature of 170° to 175° F. being optimum to effect thorough and efficient mixing.

The gamma-butyrolactone solvent and water mixture is useful in processes which prepare resinous substrates for metallization, and for desmearing resin from the inside walls of holes formed in the resinous substrates, especially high performance resinous substrates such as those made from RCC® and BT resins. The process of the invention may be practiced in a manner well known in the art using the mixture of gamma-butyrolactone and water to soften and swell the resin smear that remains after the drilling of through holes. Further process steps include permanganate removal of the resin smear, followed by neutralization of the permanganate. The process steps may be performed in conveyor equipment as a conveyorized process, or alternatively can be performed in dip tanks as a dip process. Both conveyor equipment and dip tank equipment are known in the art. Each of these process steps is described in further detail below.

The printed circuit board is immersed in the gamma-butyrolactone and water mixture for a time and at a temperature sufficient to soften and swell the resin smear on the drilled through holes. Usually the immersion time will be from about 2 to about 15 minutes for a dip process, although longer times can also be employed. A 5 minute immersion time gives satisfactory results. For a conveyorized process, the immersion time will usually be from about 1 to about 3 minutes, with an 80 second immersion time giving satisfactory results. The immersion of the printed circuit board in the gamma-butyrolactone and water mixture can be carried out at room temperature, but is usually carried out at elevated temperatures, such as from about 140° F. to about 190° F. A temperature of 185° F. (85° C.) is optimum. Preferably, the gamma-butyrolactone and water mixture is agitated during the solvent swell step to insure a homogenous mixture and also to insure an even temperature distribution throughout the mixture.

Following this solvent swell step, the printed circuit board can be rinsed in deionized water.

Rinsing steps are optionally added between the solvent swell, permanganate oxidation and neutralization steps to remove excess reagents and prolong the life of the subsequent reagent bath. Rinsing may be carried out by flooding, dipping, or spraying, as appropriate, and can be carried out at a temperature the same as one of the temperatures at which the preceding or following step is carried out, at an intermediate temperature (to provide a temperature transition), or at a different temperature, such as room temperature. The rinsing time may vary, but generally 1 to 2 minutes is a sufficient rinsing time.

Following the rinsing step, if one is employed, the printed circuit board is placed in a permanganate oxidizing solution to remove the softened resin. The permanganate solution is generally comprised of water, a water-soluble salt of permanganate, such as sodium, potassium, or lithium permanganate, and sufficient alkali to obtain a solution pH in the alkaline range. A pH of 11 or higher is preferred. Suitable permanganate solutions for use herein include the E-Prep Oxidizer 100 Series and the E-Prep Liquid Oxidizer 200 Series, both sold by Electrochemicals Inc. of Maple Plain, Minn. (USA). The E-Prep oxidizer 100 Series comprises two components, E-Prep Oxidizer 101, which is the permanganate component, and E-Prep Oxidizer 102, which is the alkaline component. A permanganate solution comprising from about 60 to about 90 grams per liter of the E-Prep Oxidizer 101 component and from about 5% to about 8% by volume of the E-Prep Oxidizer 102 component is suitable for use in the present process. An optimum solution comprises about 80 grams per liter of the 101 component and about 5.3% by volume of the 102 component. Alternatively, a permanganate solution comprising from about 20 to about 30% by volume of E-Prep Liquid Oxidizer 201 (available from Electrochemicals Inc.) as the permanganate component, and from about 4% to about 10% by volume of the E-Prep Oxidizer 102 as the alkaline component can be used in the present process. An optimum solution comprises about 22–25% by volume of E-Prep Liquid Oxidizer 201 and about 9–10% by volume of E-Prep Oxidizer 102.

The printed circuit board is placed in the permanganate solution for a time and at a temperature sufficient to remove the resin. In general, from 5 to 20 minutes is sufficient to remove the softened resin using a dip process, with 15 minutes being optimum. For a conveyorized process, from about 2 to 5 minutes is sufficient to remove the softened resin, with 3 minutes being optimum. The temperature can be from 165° F. to 185° F., with 180° F. being a typical temperature for resin removal.

After treatment with the permanganate solution, it is preferred that the printed circuit board be further treated with a neutralizing agent to neutralize the permanganate solution and remove the permanganate and manganese residues. An optional rinsing step may be added before the neutralization to remove excess permanganate solution.

In general, the neutralizing agent can be any recognized water soluble compound oxidizable by permanganate. Neutralizing agents that are contemplated for suitable use herein include an aqueous acidified stannous chloride solution, i.e. $SnCl_2$—HCl, hydroxylamine hydrochloride, formaldehyde, oxalic acid, and dilute aqueous solutions of hydrochloric or sulfuric acids. A specifically contemplated neutralizing agent is a dilute aqueous solution of sulfuric acid, such as an aqueous solution containing from 6 to 12% by volume sulfuric acid. One suitable neutralizing agent is ELECTRO-BRITE E-Prep Neutralizer Glass Etch, sold by Electrochemicals Inc. of Maple Plain, MN, which is used in this instance without the Glass Etch component. An optimum neutralizing solution contains about 20% by volume ELECTRO-BRITE E-Prep Neutralizer, and about 8% by volume sulfuric acid.

The printed circuit board is placed in the neutralizing solution for a time and at a temperature sufficient to neutralize the permanganate and remove substantially all the permanganate and manganese residues. In general, from 5 to 20 minutes is sufficient to remove the residues, with 5 minutes being optimum. It is preferred that the neutralizing solution be used at elevated temperatures in the range of 110 to 125° F. An optimum working temperature is 120° F.

In the following examples, a gamma-butyrolactone and water mixture in accordance with the present invention is compared (1) with standard solvents used for softening resin smears, and (2) with a combination of solvents, namely gamma-butyrolactone and N-methyl-2-pyrrolidone, in accordance with U.S. Pat. No. 5,985,040, to determine the usefulness of aqueous gamma-butyrolactone as the solvent. For these examples, the following procedure is used:

1. RCC®, BT, polyimide and FR4 copper clad panels are cut to a 2 inch by 2 inch (5 cm by 5 cm) size and are etched in aqueous nitric acid (50/50 v.v.) to remove the copper.
2. The panels are baked until completely dry and then weighed.
3. The panels are then placed in the solvents indicated in the examples, for a period of five minutes, at a temperature of 180° F., except for solvent (2), which is used at a temperature of 170° F.
4. The panels are then removed from the solvents, rinsed with deionized water, and placed in a permanganate oxidizing solution comprised of 22% by volume of E-Prep Oxidizer 201 as the permanganate component and 9% by volume of E-Prep Oxidizer 102 as the alkaline component, with the balance being D.I. water, at a temperature of 180° F., for 15 minutes.

5. The panels are removed from the permanganate oxidizing solution, rinsed with deionized water and placed for 5 minutes in an acid neutralizing solution containing 20% by volume ELECTRO-BRITE E-Prep Neutralizer (without Glass Etch) and 8% by volume sulfuric acid, at a temperature of 120° F.

6. The panels are then removed from the neutralizing solution, baked until dry, and reweighed.

7. The amount of weight loss is determined by comparing the weight of each panel at step 2 with its weight at step 6. The changes in weights of the various treated panels are indicated in the examples.

Comparative Examples

The solvents selected for the examples are as follows:

(1) a mixture of 50% by volume of N-methyl-2-pyrrolidone and 50% by volume deionized water;

(2) a mixture of 20% by volume E-Prep Hole Cleaner 320 (available from Electrochemicals Inc., Maple Plain, Minn.) 5% by volume of E-Prep 102 (available from Electrochemicals Inc.) and 75% by volume deionized water;

(3) a mixture of 80% by volume N-methyl-2-pyrrolidone and 20% by volume gamma-butyrolactone, and (4) a mixture of 50% by volume gamma-butyrolactone and 50% deionized water in accordance with the present invention.

Solvent (1), N-methyl-2-pyrrolidone and water is a known solvent for use in removing resin smear from FR-4 printed wire boards. Similarly, solvent (2) which comprises butylcarbitol as the solvent component, is a known solvent for removing resin smear from FR-4 printed wire boards. Solvent (3) is a mixture of two solvents that are specifically selected for removing resin smear from RCC® and BT resins, in accordance with the teachings of U.S. Pat. No. 5,985,040. Solvent (4) utilizes a single solvent, gamma-butyrolactone, in water, in accordance with the present invention. The examples were run in accordance with the steps and conditions set forth above. The results are summarized below.

| | Weight Loss in mg/cm$^2$ | | | | |
|---|---|---|---|---|---|
| | Solvent 1 M-Pyrol 50% D.I. Water 50% | Solvent 2 320 20% 102 5% D.I. Water 75% | Solvent 3 M-Pyrol 80% gamma-BLO 20% | Solvent 4 gamma-BLO 50% D.I. Water 50% | No Solvent Swell |
| Resin type | 180° F. | 170° F. | 180° F. | 180° F. | |
| FR-4 | SP/DP[(1)] 1.1/2.0 | SP/DP 0.6/1.3 | SP/DP 1.3/2.9 | SP/DP 1.7/3.4 | SP/DP 0.35/0.7 |
| BT | 0.1/0.18 | 0.09/0.16 | 0.18/0.3 | 0.2/0.4 | 0.08/0.13 |
| Polyimide | 0.8/1.35 | 0.6/1.1 | 0.76/1.3 | 0.7/1.2 | 0.53/0.91 |
| RCC ® | 0.12/0.2 | 0.1/0.17 | 0.2/0.4 | 0.22/0.5 | 0.07/0.14 |

[(1)]SP = single pass
DP = double pass

The results in the above table demonstrate that the use of the single solvent, gamma-butyrolactone, and water (solvent 4) in accordance with the present invention achieves weight loss comparable to the mixture of solvents (solvent 3) on the high performance resins such as RCC® and BT.

The results also show that the gamma-butyrolactone solvent is much more effective on the RCC® and BT resins than the standard solvents (solvent 1 and solvent 2) used for smear removal of FR-4 resins. For the polyimide material, the weight loss was about the same regardless of which solvent was used, because the polyimide material is sensitive to the alkaline component (sodium hydroxide) in the permanganate oxidizing solution.

The mixture of gamma-butyrolactone and water in accordance with the present invention achieves results that are surprisingly comparable to a two solvent mixture on the high performance resins such as RCC® and BT, and achieves better results on the FR-4, RCC® and BT resins than the solvents that are known and used for FR-4 resin smear removal. The gamma-butyrolactone and water mixture also results in a roughening of the resinous substrate material exposed at the through hole surfaces. This roughened surface advantageously contributes to improved adhesion of subsequently deposited copper to the wall of the through hole. The gamma-butyrolactone and water mixture can be used in either conveyorized or dip processes, and has an advantage over the mixture of two or more solvents in smear removal processes because the concentration of the gamma-butyrolactone and water is easier to control and maintain under production conditions than the concentrations of the combinations of solvents.

What is claimed is:

1. A desmear process for removing resin smear from drilled holes in a printed circuit board having a resinous substrate, comprising the steps of:
   a. contacting the resinous substrate with a liquid mixture comprising a solvent component and water to soften and swell the resin smear, wherein the mixture comprises from about 40% to about 50% by volume of gamma-butyrolactone and from about 60% to about 50% by volume of water;
   b. contacting the resinous substrate with an alkaline permanganate solution for a time period sufficient to remove the softened resin smear; and
   c. contacting the resinous substrate with an aqueous acidic solution for a time period sufficient to neutralize the permanganate treating solution and remove substantially all manganate residues.

2. The process of claim 1 wherein the mixture further comprises a surfactant, present in an amount effective to wet a through hole.

3. The process of claim 2 wherein the surfactant is present in an amount of from about 0.01% to about 1% by volume.

4. The process of claim 2 wherein the surfactant is present in an amount of from about 0.02% to about 0.5% by volume.

5. The process of claim 1 wherein the resinous substrate is contacted with the liquid mixture at a temperature ranging from about 140° to about 190° F.

6. A desmear process for removing resin smear from drilled holes in a printed circuit board having a resinous substrate, comprising the steps of:
   (a) softening the resin smear by contacting the resinous substrate with a mixture of about 20% to about 80% by volume gamma-butyrolactone solvent and about 80% to about 20% by volume water, wherein the gamma-butyrolactone is used as the only solvent for softening the resin smear;
   (b) contacting the resinous substrate with an alkaline permanganate treating solution for a time period sufficient to remove the softened resin smear; and
   (c) contacting the resinous substrate with an aqueous acidic solution for a time period sufficient to neutralize the permanganate treating solution and remove substantially all manganate residues.

7. The process of claim 6 wherein the gamma-butyrolactone is present in the mixture in an amount of from about 40% to about 50% by volume.

8. The process of claim 6 wherein the mixture includes a surfactant, present in an amount effective to wet a through hole.

9. The process of claim 8 wherein the surfactant is present in an amount ranging from about 0.01% to about 1% by volume.

10. The process of claim 8 wherein the surfactant is present in an amount ranging from about 0.02% to about 0.5% by volume.

11. The process of claim 6 wherein the resinous substrate is contacted with the mixture of gamma-butyrolactone and water for a period of time ranging from about 1 to about 15 minutes.

12. The process of claim 6 wherein the resinous substrate is contacted with the mixture of gamma-butyrolactone and water at a temperature ranging from about 140° to about 190° F.

* * * * *